(12) United States Patent
Scheid

(10) Patent No.: US 7,790,502 B2
(45) Date of Patent: Sep. 7, 2010

(54) METHOD OF MANUFACTURING FLEXIBLE SEMICONDUCTOR ASSEMBLIES

(75) Inventor: David R. Scheid, Eau Claire, WI (US)

(73) Assignee: Honeywell International Inc., Morristown, NJ (US)

( * ) Notice: Subject to any disclaimer, the term of this patent is extended or adjusted under 35 U.S.C. 154(b) by 76 days.

(21) Appl. No.: 11/953,541

(22) Filed: Dec. 10, 2007

(65) Prior Publication Data

US 2009/0148983 A1    Jun. 11, 2009

(51) Int. Cl.
H01L 21/00    (2006.01)
H01L 21/30    (2006.01)
H01L 21/46    (2006.01)
H01L 21/78    (2006.01)

(52) U.S. Cl. .................. 438/107; 438/110; 438/455; 257/E21.599

(58) Field of Classification Search ......... 438/107–111, 438/455–460; 257/E21.598–E21.599
See application file for complete search history.

(56) References Cited

U.S. PATENT DOCUMENTS

| | | | |
|---|---|---|---|
| 5,925,725 A * | 7/1999 | Pfeil et al. ............... | 257/777 |
| 6,918,297 B2 | 7/2005 | MacGugan ............... | 73/504.15 |
| 7,067,352 B1 * | 6/2006 | Scheid .................... | 438/109 |
| 7,095,226 B2 | 8/2006 | Wan et al. ................ | 324/247 |
| 2002/0114143 A1 | 8/2002 | Morrison et al. ......... | 361/749 |
| 2004/0231420 A1 | 11/2004 | Xie et al. ................. | 73/514.32 |
| 2005/0122101 A1 | 6/2005 | Bohlinger et al. ........ | 324/252 |
| 2006/0068567 A1 * | 3/2006 | Beyne et al. ............. | 438/460 |
| 2006/0205106 A1 | 9/2006 | Fukuda et al. ........... | 438/52 |

\* cited by examiner

Primary Examiner—Savitri Mulpuri
Assistant Examiner—Calvin Choi
(74) Attorney, Agent, or Firm—Shumaker & Sieffert, P.A.

(57) ABSTRACT

A method for producing flexible semiconductor assemblies is described. For example, an integrated circuit package consisting of an X-Y axes sensor die and a Z-axis sensor die disposed at 90 degrees to each other may be formed by applying a flexible dielectric membrane to a semiconductor wafer, creating bending gaps between the sensor dice, singulating the IC package from the wafer, and bending the flexible dielectric membrane so that the sensor dice are disposed orthogonally to each other. This method eliminates the need to precisely position previously singulated sensor dice relative to each other in order to apply a flexible dielectric membrane for purposes of interconnecting the dice.

18 Claims, 7 Drawing Sheets

B-B VIEW (WITH CHUCK)

TOP VIEW

SIDE VIEW

VIEW A-A

TOP VIEW (AFTER INVERTING)

B-B VIEW

B-B VIEW (WITH CHUCK)

METHOD OF MANUFACTURING FLEXIBLE SEMICONDUCTOR ASSEMBLIES

FIELD

The invention relates to semiconductors and more specifically to manufacturing flexible semiconductor assemblies.

BACKGROUND

Some sensors, such as magnetometers or accelerometers, are designed to sense in three axes. Typically, these axes are orthogonal and thus require that one of the sensor axes be mounted perpendicular to a printed circuit board (PCB) or other assembly used for mounting electronic components. One method of creating a three-axis sensor is to form an integrated circuit consisting of two or more semiconductor dice connected by a flexible interconnect. The flexible interconnect may be bent at a ninety degree angle such that one of the semiconductor dice is at a right angle to the other die. U.S. Pat. No. 7,067,352 describes such an assembly and is hereby incorporated-by-reference in its entirety. Arranging semiconductor devices in this manner typically increases the silicon efficiency (e.g., the efficient utilization of silicon real estate), and requires shorter interconnection lengths between the semiconductor devices, which, in turn, reduces the time required for a signal to travel between the semiconductor devices. The shorter interconnection lengths also reduce parasitic capacitance and resistance, which, in turn, reduces power consumption.

Currently, forming a flexible semiconductor assembly requires that individual semiconductor dice intended for use in the assembly be gathered and precisely positioned relative to each other in an assembly jig before a flexible film can be attached and interconnections made. This process requires specialized pick-and-place equipment for gathering and accurately placing the dice and adds time and cost to the production of three axis sensors or any other semiconductor assemblies requiring dice connected by flexible interconnects. Thus, a method for more efficiently producing flexible semiconductor assemblies is desired.

SUMMARY

A method for producing flexible semiconductor assemblies is described. One embodiment of the present invention may take the form of a method for fabricating an integrated circuit package from a solid wafer. The wafer may comprise at least two semiconductor dice arranged adjacent to one other. The at least two dice are intended to form part of an integrated circuit package. A flexible dielectric membrane may be attached to a first side of the wafer to form a wafer assembly. The flexible dielectric membrane may electrically interconnect the group of at least two adjacent semiconductor dice. Wafer material may then be removed from the second side of the wafer to form one or more bending regions, where the wafer material between the grouped dice is removed substantially to the depth of the flexible dielectric membrane. The integrated circuit package may then be singulated by removing the wafer material and flexible membrane material connecting the group of semiconductor dice to the rest of the wafer assembly. Finally, the flexible dielectric membrane may be bent at the one or more bending regions such that the two semiconductor dice are disposed at some angle to each other, preferably 90 degrees. This method does not require that the individual, previously singulated semiconductor dice be arranged in a precise relationship to each other by a mechanical device prior to application of a flexible interconnect; rather, the flexible interconnect may be applied directly to a solid wafer holding multiple groups of semiconductor dice. This method eliminates fabrication steps and reduces manufacturing costs.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

DETAILED DESCRIPTION

Figure 1A:
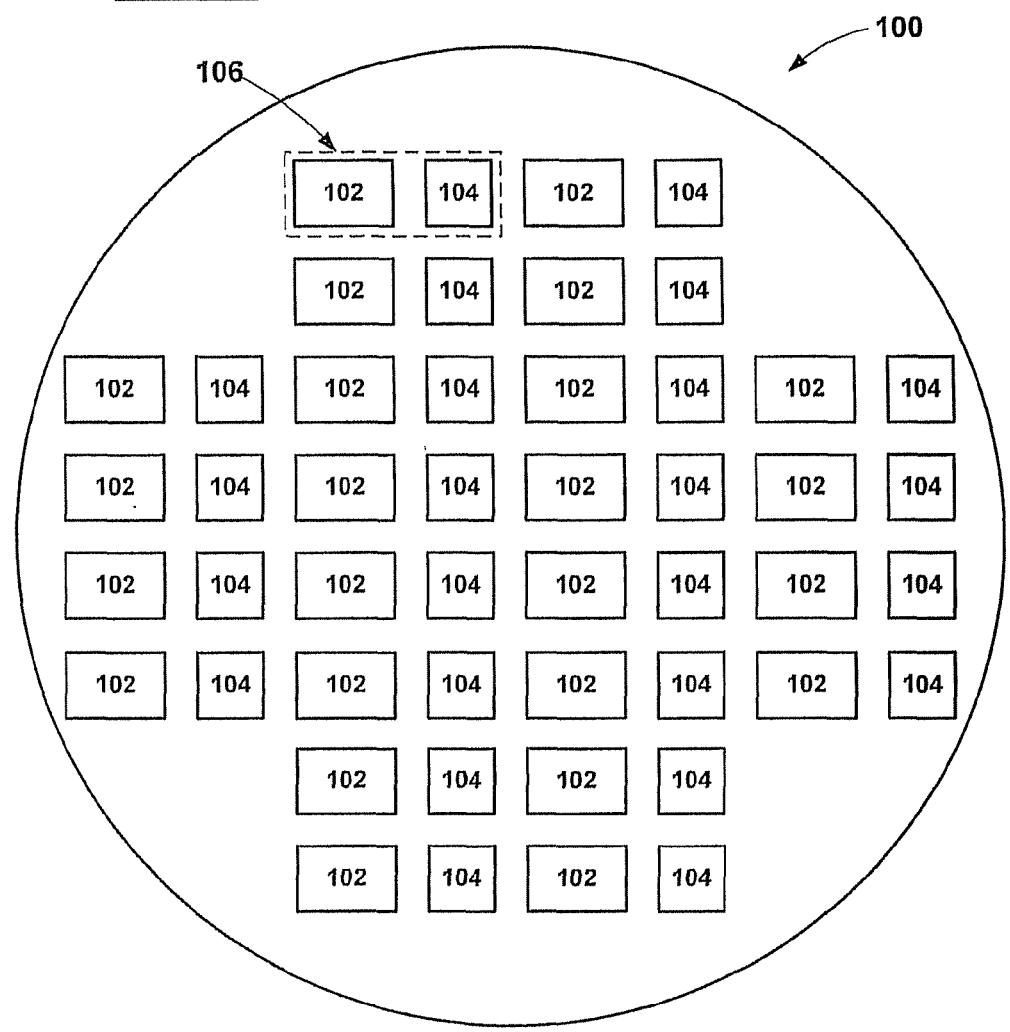
FIG. 1a is top view of a typical semiconductor wafer.

FIG. 1a is top view of a typical semiconductor wafer 100. The wafer 100 includes multiple semiconductor dice such as dice 102 and dice 104. For example, each die 102 might be intended as the X-Y axis sensor in a three dimensional integrated circuit sensor assembly. Similarly, each die 104 might be intended as the Z-axis sensor in the same integrated circuit sensor assembly. Together, a die 102 and a die 104 pair may be considered part of a dice group 106 that is intended to form an integrated circuit package. Although only one dice group 106 is highlighted in FIG. 1a, many dice groups may exist across the wafer 100.

A typical die 102, functioning as an X-Y axis sensor, may measure approximately 1.5 mm×1.6 mm; however, the die 102 may be orders of magnitude larger or smaller without adversely affecting the invention described herein. A typical die 104, functioning as a Z axis sensor, may measure approximately 0.7 mm×1.6 mm; however, the die 104 may be orders of magnitude larger or smaller without adversely affecting the invention described herein. The typical wafer 100 may be between 300 microns and 800 microns thick, though a wafer may be formed thicker to help reduce breakage of the dice 102 and 104 during handling steps or formed thinner to reduce or eliminate the need for later die thinning steps. The typical wafer 100 may be between 100 mm and 300 mm in diameter, though wafers may be larger or smaller without affecting the invention.

Figure 1B:
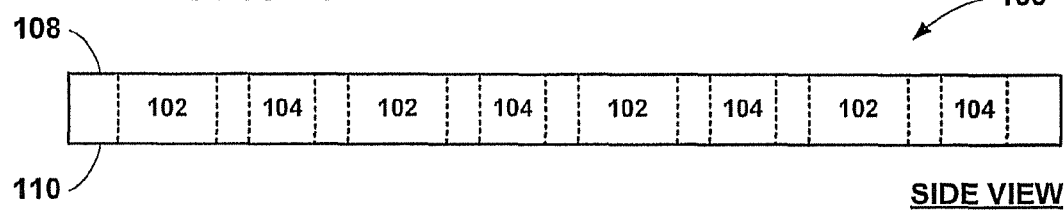
FIG. 1b is a side view of a typical semiconductor wafer.

FIG. 1b is a side view of a typical semiconductor wafer. The wafer has a first side 108 and a second side 110. The first side 108 of the wafer may be considered the top side of the semiconductor dice 102 and 104, where each die comprises integrated circuitry constructed by one of many known methods. For example, the integrated circuitry may be constructed on a bare wafer by film deposition, lithography and masking, etching, implanting and/or diffusion techniques.

Figure 2A:
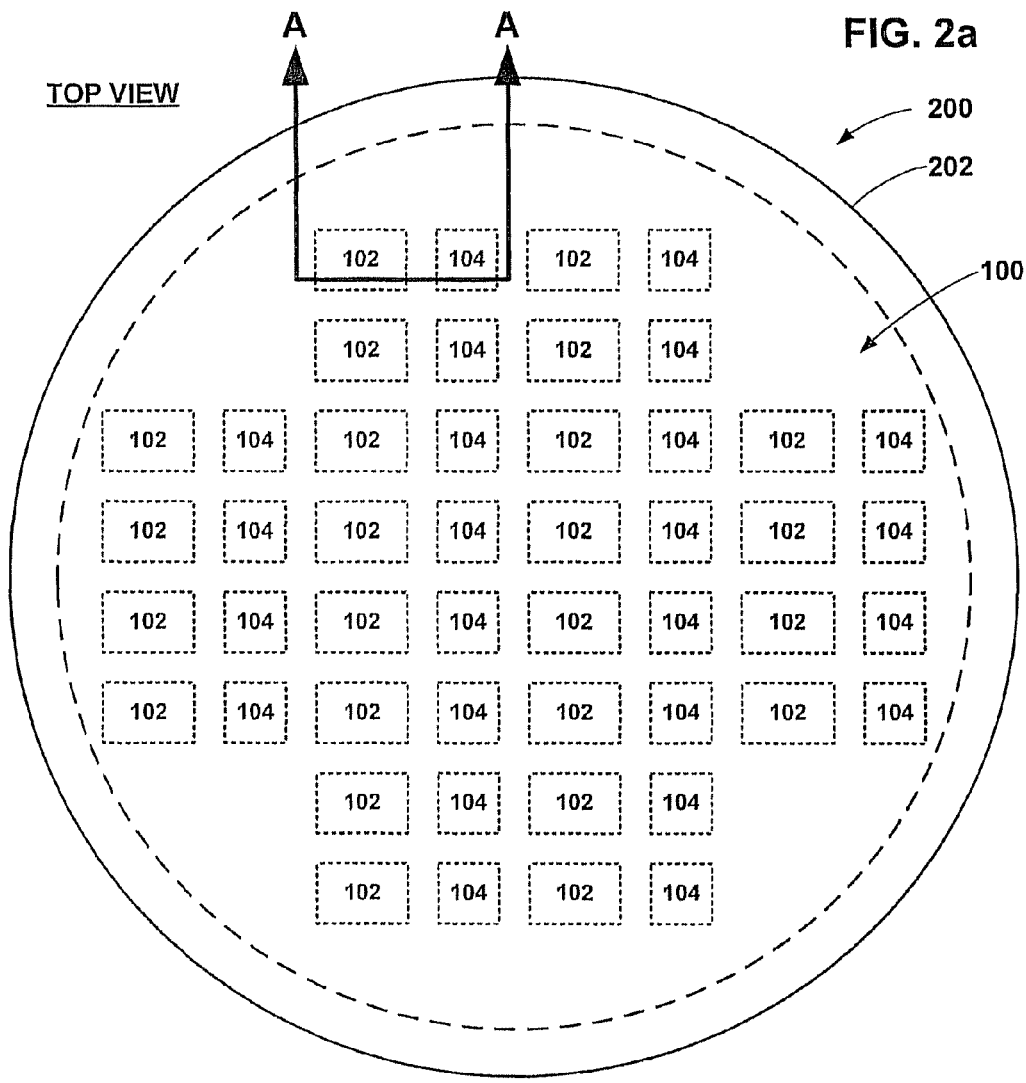
FIG. 2a is a top view of a semiconductor wafer assembly.
Figure 2B:
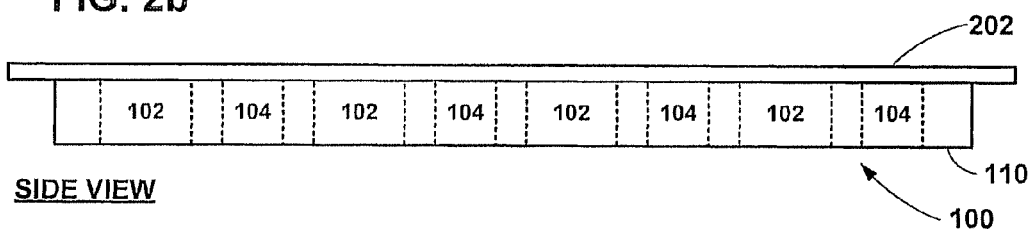
FIG. 2b is a side view of a semiconductor wafer assembly.

FIG. 2a is a top view of a semiconductor wafer assembly 200. In FIG. 2a, a flexible dielectric membrane 202 has been attached to the first side 108 of the wafer 100, creating the wafer assembly 200. FIG. 2b is a side view of semiconductor wafer assembly 200. Typically, the flexible dielectric membrane 202 may comprise a material that may be used as a passivation coating or as an interlevel dielectric layer. In a preferred embodiment, the flexible dielectric membrane 202 may comprise a polyimide material. Other flexible materials may also be used, such as a liquid crystal polymer material. The material used is flexible enough to facilitate bending in the folding region described in FIGS. 5-7 and also capable of withstanding the processing temperatures and chemicals used in any subsequent thin film fabrication process.

Figure 3:
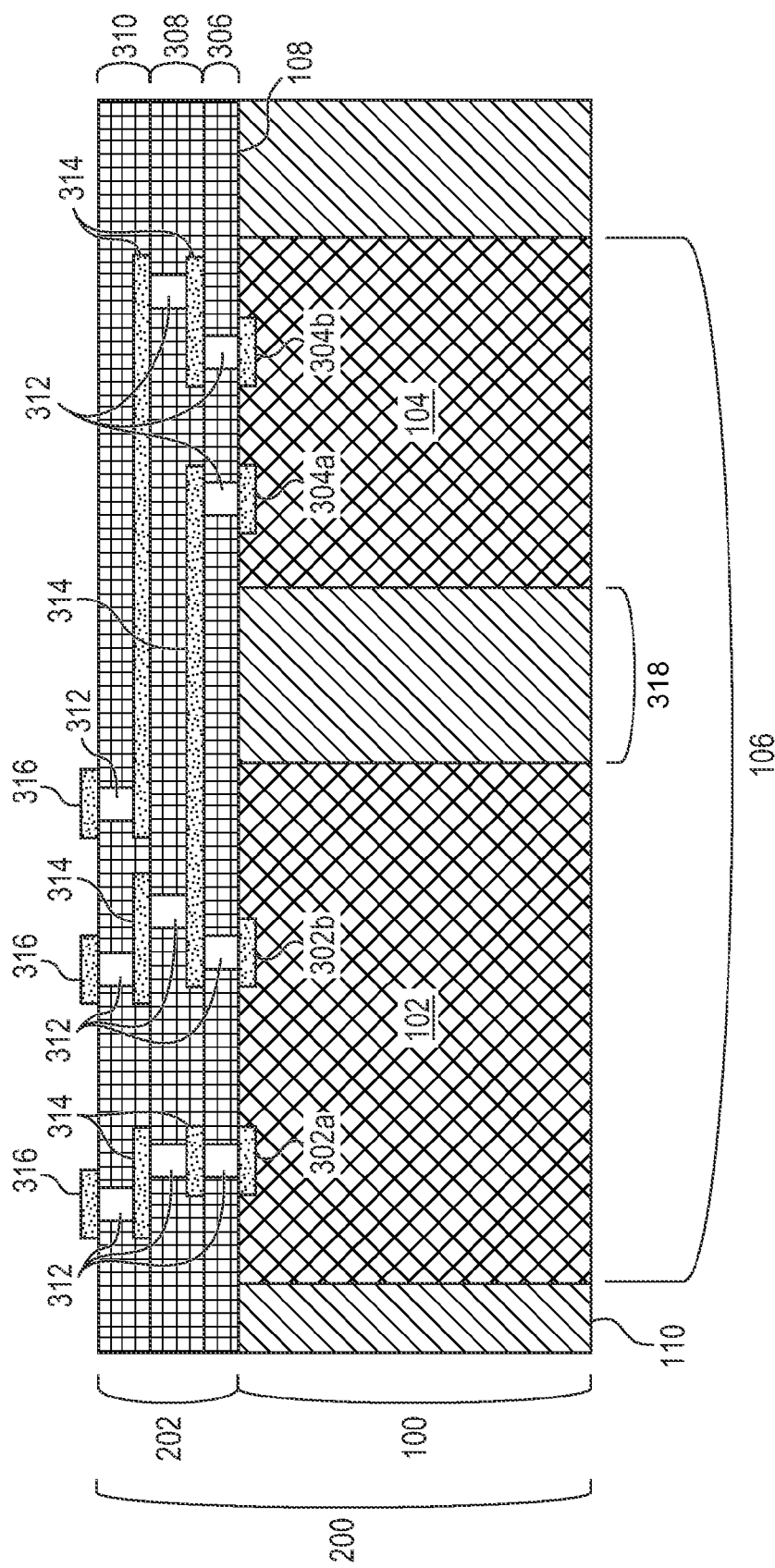
FIG. 3 is a cross-section view of a group of semiconductor dice within a semiconductor wafer assembly.

FIG. 3 is a cross-section view of a group 106 of semiconductor dice 102 and 104 within the semiconductor wafer assembly 200. As an example only, the attached flexible dielectric membrane 202 is shown as three layers: a first layer 306, a second layer 308, and a third layer 310. The flexible dielectric membrane 202 may alternatively consist of a single layer or multiple layers consisting of more or less than three layers. The dice 102 and 104 are shown formed with electrical interconnect pads 302a, 302b and 304a, 304b respectively. The dice 102 and 104 may have more or less than two electrical interconnect pads each and the pads may be formed as part of the normal fabrication process for wafer 100. Pads 302a and 302b provide electrical connections to the integrated circuitry within the semiconductor die 102. Likewise, pads 304a and 304b provide electrical connections to the integrated circuitry within the semiconductor die 104.

FIG. 3 further shows multiple separate vias 312 forming electrical interconnections between the layers 306, 308, and 310 and between the layer 306 and the dice 102 and 104. Further multiple routes 314 are shown as forming electrical interconnections between various vias on layers 306, 308, and 310. The particular placement of routes and vias in FIG. 3 are shown as an example only and are not meant to limit the placement of such elements to certain locations, layers, or interconnection points.

While the flexible dielectric membrane 202 shown in FIG. 3 comprises three layers 306, 308, and 310, fewer or additional layers within the membrane 202 may be created, depending on the external and internal interconnection requirements of the semiconductor dice 102 and 104. Layers may each be made of the same material or may comprise different flexible materials. As an example, the layers 306, 308, 310 may be formed using a polyimide dielectric and the routes 314 and vias 312 may be copper, aluminum, gold, or platinum conductors.

In one embodiment, the flexible dielectric membrane 202 may comprise a layer 306 that is laminated, in an autoclave under pressure and temperature, to the first side 108 of the wafer 200. After lamination, the flexible dielectric membrane layer 306 may provide a new planar surface for subsequent thin film processing. Other methods of creating a flexible dielectric membrane 202 on the first side 108 of the wafer 200 may also be used. For example, the layer 306 may be spun-on.

After the first layer 306 of the flexible dielectric membrane 202 has been created, one or more vias 312 may be created from the top surface of the first layer 306 down to the die pads 302a, 302b, 304a, and 304b. Typically, a photolithography process may be used to create the vias 312. Other known processing methods may also be used to create the vias 312.

A flexible conductive layer may be deposited over the top surface of the first layer 306 of the flexible dielectric membrane 202 by, for example, blanket deposition. The blanket deposition may be applied by known physical deposition techniques such as evaporation, sputtering, plating, or by known chemical deposition techniques such as chemical vapor deposition (CVD). The conductive layer may comprise a metal such as copper, aluminum, gold, platinum, or other such conductive materials. In addition to conductive metals, other interconnect materials may also be used.

The blanket deposition deposits the conductive material within the vias 312 and on the top surface of layer 306. A patterning process may then selectively remove deposited portions of the conductive material from the top surface layer 306 to form electrical conductor routes that may interconnect the semiconductor dice 102 and 104. As shown in FIG. 3, the patterning process removes portions of the conductive material from the top surface of the first layer 306 to form electrical interconnection pads and routes 314.

After the patterning step is complete, a second layer 308 of the flexible membrane 202 may be deposited. The second layer 308 may comprise the same material as the first layer 41, or may comprise a different flexible material. The second layer 308 may be deposited by known methods, such as by lamination or by spin-on application. The dielectric deposition process described above, as well as the fabrication, conductor deposition, and interconnect patterning processes, may then be repeated to form additional electrical interconnection for the second layer 308 of the flexible dielectric membrane 202.

As shown in FIG. 3, the second layer 308 includes vias 312 at selective locations, and each via 312 has deposited therein a conductive material. Electrical interconnection routes 314 are used to form bonding pads and electrical interconnections to an adjacent upper layer 310. Illustratively, the upper layer 310 of the flexible dielectric membrane 202 is the final passivation layer. Optionally, the final passivation layer may include wire bond pads 316 or other means of making external electrical connections, such as solder balls or bumps, which are discussed further in reference to FIGS. 6 and 7.

While only electrical interconnections are shown in FIG. 3, thin film passive elements, such as resistors or capacitors, may also be included in one or more layers of the flexible dielectric membrane 202. Typically, the passive elements will be located in regions of flexible dielectric membrane 202 directly above the top surfaces of the semiconductor dice 102 and 104 (on the wafer side 108), and not above the region 318 between the dice 102 and 104. This is because the passive components may not be as flexible as the rest of the elements of the flexible dielectric membrane 202; therefore, placing the passive elements in an area of the flexible dielectric membrane 202 that will not be bent helps prevent damage to the passive elements during bending. However, if the curvature of the flexible dielectric membrane 202 after the bending process is such that a passive element will not be damaged and the passive element will be able to operate normally, the passive element may be located in a region of the flexible dielectric membrane 202 above the region 318.

Figure 4A:
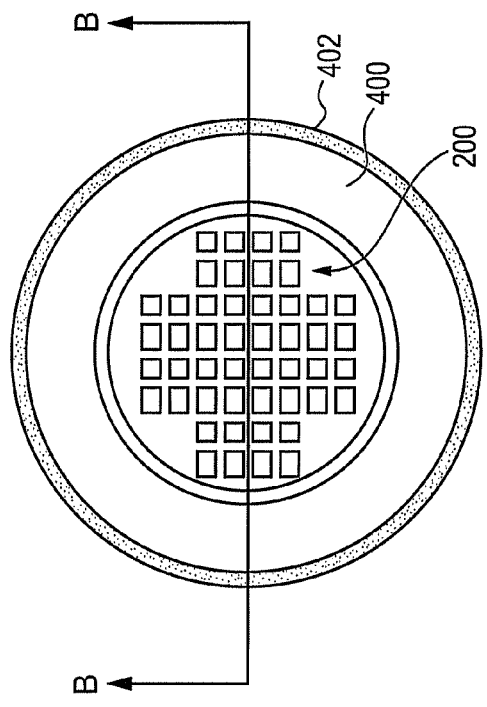
FIG. 4a is a top view of a semiconductor wafer assembly fixed to a dicing tape frame.
Figure 4B:
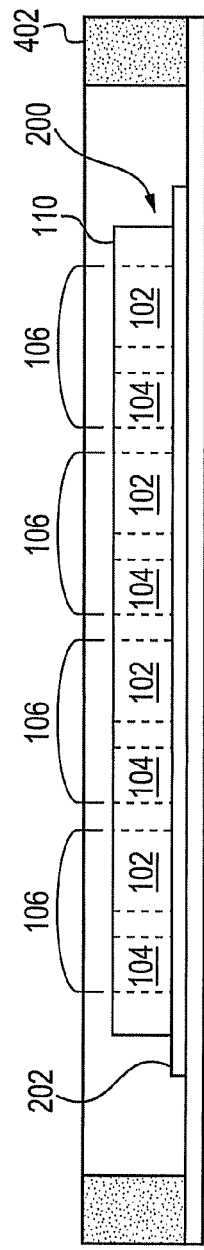
FIG. 4b is a cross-section view of a semiconductor wafer assembly fixed to a dicing tape frame.
Figure 5:
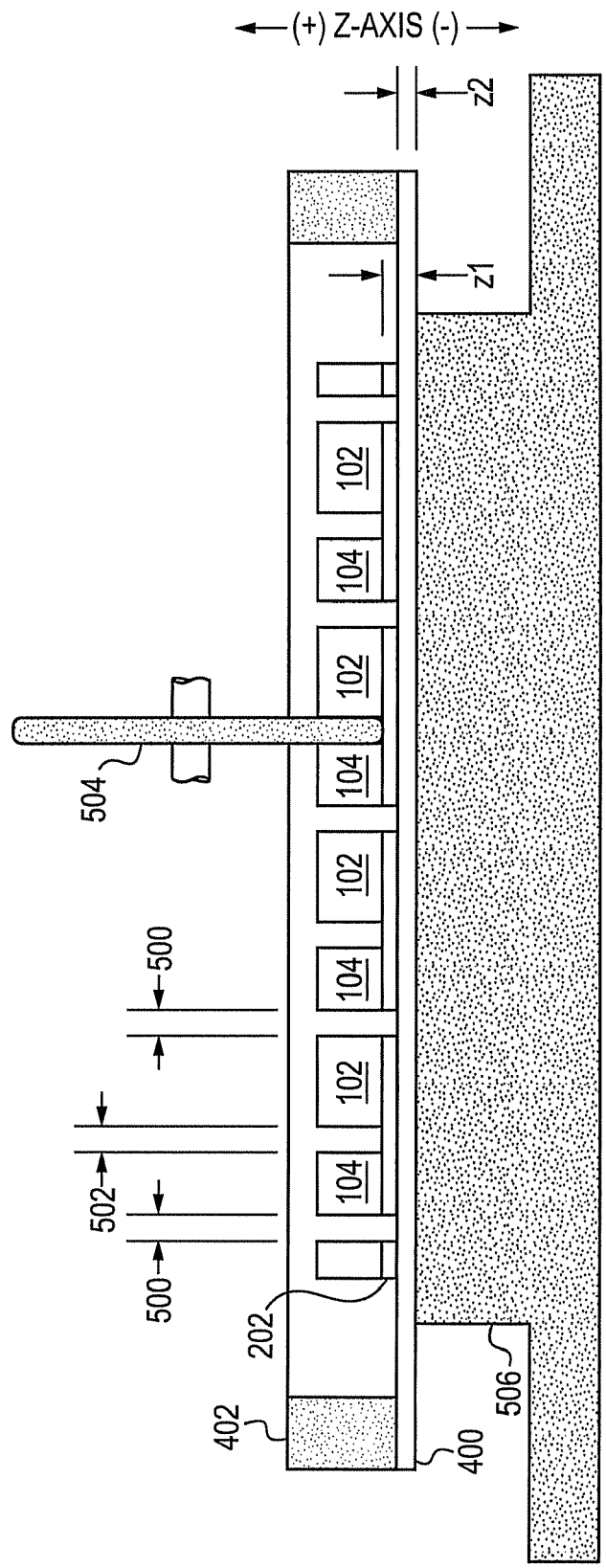
FIG. 5 is a cross-section view of a semiconductor wafer assembly fixed to a dicing tape frame and held by a chuck.

After the electrical interconnections have been created in the flexible membrane 202, bending regions may be created and the dice groups 106 singulated. FIGS. 4a, 4b, and 5 show a preferred embodiment of this method for creating bending regions and singulating the dice groups. FIG. 4a is a top view of the semiconductor wafer assembly 200 fixed to a dicing tape frame 402 by means of an adhesive dicing tape 400. FIG. 4b is a cross-section view of semiconductor wafer assembly 200 fixed to the dicing tape frame 402. FIGS. 4a and 4b show a preferred method of holding the wafer assembly 200 so that bending regions may be created and dice groups may be singulated. According to FIG. 4a and FIG. 4b, the dicing tape 400 may be stretched taught and attached to the dicing frame 402 by means commonly know in the art. The wafer assembly 200 may be inverted and secured to the dicing tape 400 by means of the adhesive present on the dicing tape 400.

Alternatively, the wafer assembly 200 may be held by other means. For example, the wafer assembly 200 may be fixed to a work surface other than a dicing tape frame 402 by means other than dicing tape 400. For example, a bonding agent (not shown), such as one of many die-bonding adhesive pastes known in the art, may be used to hold the wafer assembly 200 to an alternative work surface (not shown). Alternatively, the bonding agent may be a die bonding film. The bonding agent may be any material that affixes the wafer assembly 200 to a work surface. As another embodiment, the wafer assembly 200 may be directly affixed to a work surface by other means, such as vacuum. In such an embodiment, a bonding agent may not be required. The wafer assembly 200 may be in direct contact with a work surface or may be separated by an intermediary material, such as a gasket material in the case of vacuum fixturing.

FIG. 5 is a cross section view of semiconductor wafer assembly 200 fixed to the dicing tape frame 402, where the dicing tape frame 402 is fixed to a work surface, such as vacuum chuck 506. The chuck 506 may be of any suitable design and many are know in the art for holding dicing tape frames. In order to separate the dice groups 106 into usable, individual devices, the groups 106 must be separated from the wafer assembly 200. In a preferred embodiment, the groups 106 are singulated using a dicing saw 504 while the dicing tape frame 402 is held by the chuck 506. Alternatively, the groups 106 may be singulated using a dicing saw 504 while the wafer assembly 200 is attached directly or indirectly to an alternative work surface, as previously described.

During the singulation process, bending gaps 502 between dice 102 and dice 104 may first be created. To create the gap 502, the depth of the dicing saw 504 may first be set to a relative height z1 from the top of the chuck 506. While set at this height, the dicing saw 504 may then be used to remove the wafer material between die 102 and die 104, but not the flexible dielectric membrane 202 that interconnects the die 102 and die 104. The z-axis height of the dicing saw 504 may be set such that substantially all of the wafer material in gap 502 is removed. Alternatively or additionally, an insubstantial layer of wafer material may be left on top of the flexible membrane layer 202 so that the dicing saw 504 does not damage the flexible membrane layer 202. Any remaining layer of wafer material within gap 502 should be thin enough so as to not affect the desired bending characteristics of the flexible membrane layer 202 within the region of the bending gap 502. As another alternative, the dicing saw 504 may be allowed to remove an insubstantial portion of the flexible membrane layer within the gap 502 to ensure that all the wafer material is completely removed between die 102 and die 104. Though a dicing saw is the preferred method of creating the bending gaps 502, other methods may be used. For example, etching may used to remove the wafer material to substantially the depth of the flexible membrane 202. Other material removal methods, such as laser ablation, may also be used.

The desired width of the bending gap 502 may be influenced by the final thickness of dice 102 and/or 104, as their thickness and relative spacing may determine the minimum allowable bend radius of the flexible membrane 202. The bending gap 502 may most preferably be 35 microns wide, as that matches a common dicing saw blade width and allows an adequate bend radius between the dice used in a typical 3-axis sensor package. However, the width of bending gap 502 may reasonably be within a range of 10 microns to 100 microns. Larger gaps widths are also possible, if required. The typical range of bending gap 502 widths formed using a dicing saw is between 10 microns and 50 microns, though larger gap widths may be created by using wider saws or by taking multiple saw passes within the gap 502. The typical range of bending gap 502 widths as a result of etching is between 10 microns and 100 microns.

After the bending gap 502 is created, the dice groups 106 may be separated from each other and from the wafer 200 by creating cut paths, such as cut paths 500. To create a cut path 500, the dicing saw 504 may be set to a relative height z2 from the top of the chuck 506. While set at this height, the dicing saw 504 may then be used to remove the wafer material and the flexible membrane layer 202 between individual dice groups 106. The z-axis height of the dicing saw 504 may be set such that substantially all of the flexible membrane layer 202 in cut paths 500 is removed. Alternatively or additionally, the z-axis height of the dicing saw 504 may be set such that a portion of dicing tape 400, if present, is also removed, ensuring that the dice groups 106 are separated from each other.

Cut paths 500 are shown in one axis only in FIG. 5, but it should be understood that cut paths 500 may be oriented in more than one axis, so that all sides of dice groups 106 are separated from the remaining wafer assembly 200. Further, it should be understood that the order of operations for singulating the dice groups 106 need not be as described. For example, the dicing saw 504 may first create cut paths 500 and then bending gaps 502. Alternatively or additionally, the dicing saw 504 may alternate between creating cut paths 500 and bending gaps 502. Further, the dicing saw 504 may make multiple cuts at sequentially deeper z-axis heights before reaching the desired final z1 or z2 height. Also, the relative z-axis location of the dicing saw 504, shown here as z1 and z2, need not be defined as a dimension relative to the top of the chuck 506. Instead, the z-axis position of the dicing saw 504 may be defined relative to any surface shown or an absolute or relative coordinate system independent of the wafer assembly 200 and the chuck 506. Also, the gaps 502 and cut paths 500 may be similarly formed by the dicing saw 504 while the wafer assembly 200 is fixtured to an alternative work surface, either directly, or through an intermediate device, such as dicing tape and a dicing tape frame.

In addition to singulation, other operations may also be performed while the wafer assembly 200 or the singulated groups 106 are secured to the chuck 506 or an alternative work surface. For example, either or both die 102 and die 104 may be thinned by backgrinding or through other material removal operations, such as laser ablation or etching. Typically, the active layer on the first surface 108 of the semiconductor dice 102 and 104 is less than 10 microns deep, which may be substantially less than the overall thickness of the dice; accordingly, the semiconductor dice 102 and 104 may be thinned to reduce their overall thickness. Thinning may occur prior to, during, or after, singulation.

Figure 6:
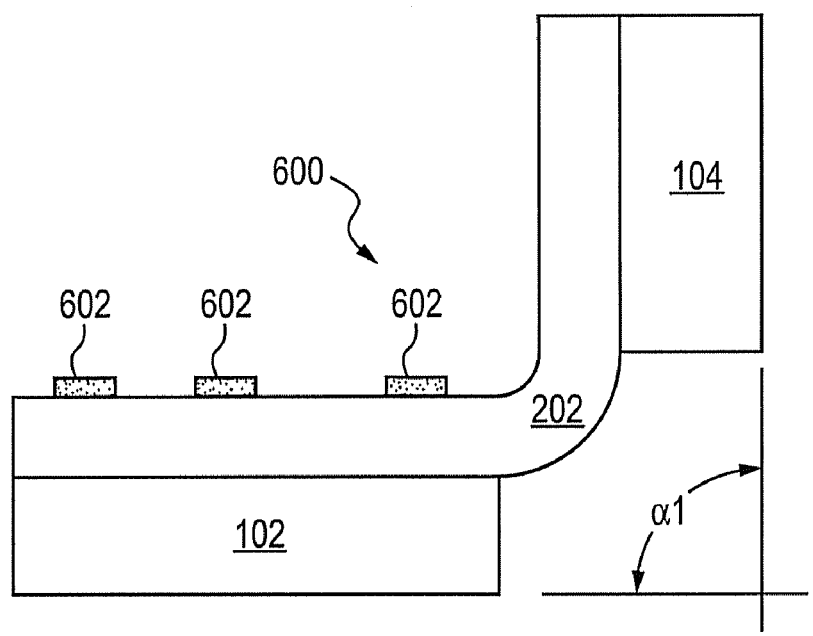
FIG. 6 is a side view of a flexible integrated circuit package.

FIG. 6 is a side view of a flexible integrated circuit package 600 that may be created from a dice group 106. The IC package 600 may, for example, be a 3-axis sensor package, with die 102 functioning as an X-Y multi-axis sensor device and die 104 functioning as a Z-axis sensor device, where both are electrically connected by interconnects within the flexible membrane 202. The IC package 600 may be formed by bending dice group 106 at the die gap 502 such that die 104 is at some angle $\alpha 1$ relative to die 102, preferably 90 degrees. In a typical 3-axis sensor package, the total height of IC package 600 (or IC package 700, as described later) may be around 1.1 mm, though sizes for other IC packages may vary considerably.

The IC package 600 includes a means of electrically connecting the IC package 600 to other devices. As shown in FIG. 6, the IC package 600 may contain a plurality of wire bond pads 602. The wire bond pads 602 may be distributed to accommodate wire connections to other devices. The wire bond pads 602 may be electrically connected by interconnections within the flexible membrane 202 to the dice 102 and 104. The connections allow the input and output of signals and/or power and ground to or from the dice 102 and 104. The location and quantity of the wire bond pads 602 in FIG. 6 is provided as an example only. The location of the wire bond pads 602 can vary based on design requirements. Preferably, the wire bond pads 602 are located on a single side of the IC package 600, as depicted in FIG. 6.

Figure 7:
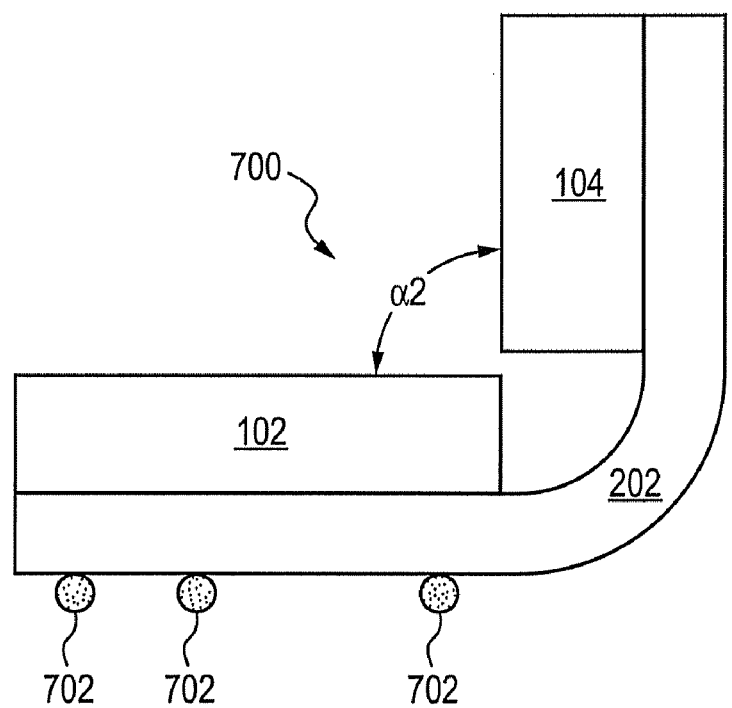
FIG. 7 is a side view of a flexible integrated circuit package.

FIG. 7 is a side view of another flexible integrated circuit package 700 that may be created from a dice group 106. The IC package 700 may, for example, be a 3-axis sensor package, with die 102 functioning as an X-Y multi-axis sensor device and die 104 functioning as a Z-axis sensor device, where both are electrically connected by interconnects within the flexible membrane 202. The IC package 700 may be formed by bending dice group 106 at the die gap 502 such that die 104 is at some angle α2 relative to die 102, preferably 90 degrees.

The IC package 700 includes a means of electrically connecting the IC package 700 to other devices. As shown in FIG. 6, the IC package 700 may be formed in a flip chip configuration and may contain a plurality of solder balls 702, or other means of establishing electrical connections to the IC package 700. For example, the solder balls 702 may instead be solder bumps, gold bumps, conductive adhesive bumps. The solder balls 702 may be distributed to accommodate wire connections to other devices. The solder balls 702 may be electrically connected by interconnects within the flexible membrane 202 to the dice 102 and 104. The connections allow the input and output of signals and/or power and ground to or from the dice 102 and 104. The location and quantity of the solder balls 702 in FIG. 7 is provided as an example only. The location of the solder balls 702 can vary based on design requirements. Preferably, the solder balls 702 are located on a single side of the IC package 700, as depicted in FIG. 7.

Figure 8:
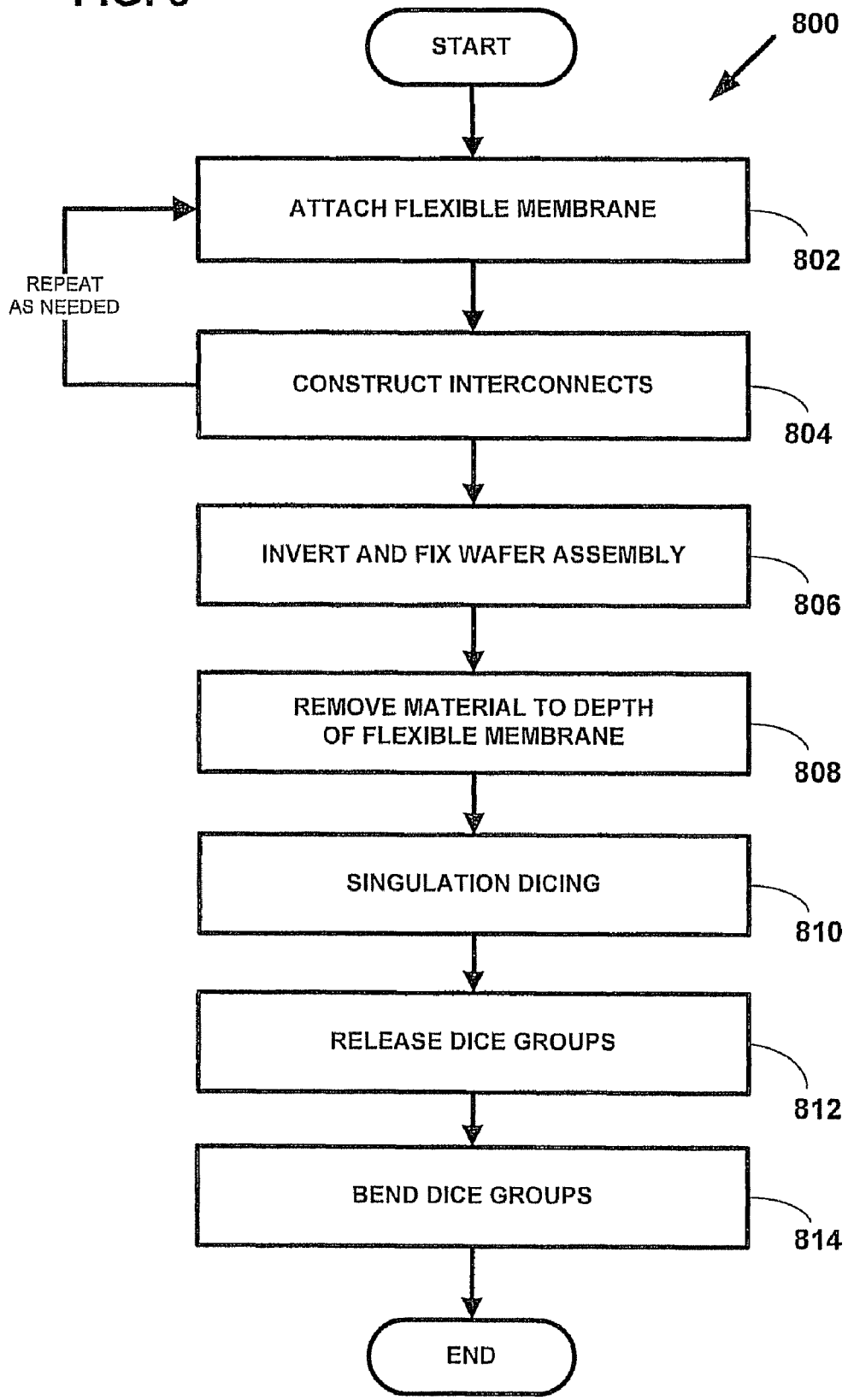
FIG. 8 is a flow chart depicting a method of creating a flexible integrated circuit package.

FIG. 8 is a flow chart depicting a preferred method 800 of creating flexible integrated circuit packages, such as IC packages 600 or 700. At block 802, a flexible membrane, such as flexible membrane 202 or layer 306 of flexible membrane 202 is attached to a wafer, such as wafer 100, to form a wafer assembly, such as wafer assembly 200. Methods as described with reference to FIGS. 2 and 3 may be used to attach the flexible membrane to the wafer. At block 804, electrical interconnects are constructed on or within the flexible membrane as previously described, for example, with respect to FIG. 3. The steps of applying layers of flexible membrane and forming interconnects may be repeated as needed to create the appropriate electrical interconnections.

At block 806, the wafer assembly may be inverted and fixed to a work surface, such as dicing chuck 506 in conjunction with a dicing tape frame 402 and dicing tape 400, as discussed, for example, with respect to FIGS. 4a, 4b, and 5. At block 808, wafer material between dice may be removed so as to create bending regions, such as the bending gaps 502 shown with respect to FIG. 5. At block 810, dice groups, such as dice group 106 may be singulated by removing substantially all of the wafer material and flexible membrane material connecting individual dice groups to each other and the remaining wafer assembly. At block 812, the singulated dice groups may be released from the dicing tape frame or alternative work surface with an injector pin to facilitate further processing. Alternatively, one or more dice within a dice group may be left secured to the work surface while the remaining dice within each dice group are released from their secure attachment to the work surface, so as to facilitate future bending of the dice group. The dice groups may be released by means appropriate to their method of fixturing. For example, if a UV-reactive bonding agent is used to initially secure the wafer assembly to the work surface, UV light may be used to release the dice or dice groups. If vacuum is used to initially secure the wafer assembly to the work surface, selective removal of vacuum sources may be used to release the dice or dice groups. Other possibilities include heat-reactive bonding agents and chemically responsive bonding agents.

At block 814, the flexible membrane layer may be bent so that individual dice within each dice group are at some angle relative to each other as shown, for example, with respect to FIGS. 6 and 7. Bending may be accomplished with a perpendicular fixture or any means now known or developed in the future to bend dice packages.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A method of fabricating an integrated circuit package from a wafer comprising a plurality of semiconductor dice, the wafer defining a first side and a second side, the method comprising:
    attaching a flexible dielectric membrane to the first side of the wafer to form a wafer assembly, wherein the flexible dielectric membrane electrically interconnects a group of at least two adjacent semiconductor dice that are intended to form the integrated circuit package;
    removing wafer material from the second side of the wafer to form one or more bending regions, wherein the wafer material is removed substantially to the depth of the flexible dielectric membrane, and further wherein the wafer material is removed between the at least two adjacent semiconductor dice within the group; and
    singulating the integrated circuit package by removing the wafer material and flexible membrane material connecting the group of semiconductor dice to the wafer assembly.

2. The method of claim 1, wherein attaching the flexible dielectric membrane comprises laminating a sheet of flexible dielectric material to the wafer.

3. The method of claim 1, wherein attaching the flexible dielectric membrane comprises spinning at least one layer of a flexible dielectric material onto the wafer.

4. The method of claim 1, wherein the flexible dielectric membrane comprises a polyimide film.

5. The method of claim 1, wherein attaching the flexible dielectric membrane comprises:
    creating vias through the flexible dielectric membrane down to the at least two adjacent semiconductor dice;
    depositing a conductive material in the vias; and
    forming conductive interconnection routes between the vias to create an interconnection interface.

6. The method of claim 5, further comprising:
    attaching multiple sequential layers of a flexible dielectric material to form the flexible dielectric membrane, wherein the first sequential layer is attached to the wafer and each subsequent sequential layer is attached to the prior sequential layer; and after each layer is attached, creating electrical interconnects by (i) creating vias through one or more of the flexible dielectric material layers, (ii) depositing a conductive material within the vias, and (iii) forming conductive interconnection routes between the vias to create an interconnection interface.

7. The method of claim 1, further comprising creating a pad layer at a section of the flexible dielectric membrane, wherein the pad layer overlays at least one of the plurality of semiconductor dice and is suitable for subsequent flip chip attachment or wire bond assembly.

8. The method of claim 1, wherein removing the wafer material comprises sawing the wafer assembly using a dicing saw, wherein the height of the dicing saw is set to remove substantially all of the wafer material between the at least two adjacent semiconductor dice within the group without substantially removing the flexible dielectric membrane.

9. The method of claim 1, wherein removing the wafer material comprises etching the wafer assembly to remove substantially all of the wafer material between the at least two adjacent semiconductor dice within the group without substantially removing the flexible dielectric membrane.

10. The method of claim 1, wherein singulating the integrated circuit package comprises sawing through the wafer assembly using a dicing saw.

11. The method of claim 1, wherein singulating the integrated circuit package comprises etching through the wafer assembly.

12. The method of claim 1, further comprising backgrinding the second side of the wafer to decrease the thickness of each of the at least two semiconductor dice.

13. The method of claim 1, further comprising backgrinding a side of the integrated circuit package opposite the flexible membrane to decrease the thickness of at least one of the semiconductor dice.

14. The method of claim 1, further comprising bending the flexible dielectric membrane at the one or more bending regions.

15. The method of claim 14, wherein bending the flexible dielectric membrane at the one or more bending regions comprises defining an angle between two adjacent dice within a range of 0 to 180 degrees.

16. The method of claim 1, wherein removing wafer material from the second side of the wafer to form one or more bending regions comprises forming a die gap region with a width between adjacent dice of between 10 microns and 100 microns.

17. A method of fabricating an integrated circuit package from a wafer comprising a plurality of semiconductor dice, the wafer defining a first side and a second side, the method comprising:

laminating a flexible dielectric sheet as a first dielectric layer to the first side of the wafer to form a wafer assembly;

using photolithography to create a first set of vias, wherein the first set of vias penetrates through the first dielectric layer to a group of at least two adjacent semiconductor dice that are intended to form the integrated circuit package;

depositing a first conductive material in the vias;

forming conductive interconnection routes between the vias to create a first interconnection interface;

depositing a second flexible dielectric layer;

using photolithography to create the second set of vias, wherein the second set of vias penetrates through the second dielectric layer to the interconnection interface of the first dielectric layer;

depositing a second conductive material in the second set of vias;

forming conductive interconnection routes between the second set of vias to create a second interconnection interface;

orienting the wafer assembly so that the second wafer side is face up;

using a dicing saw to remove wafer material from the second side of the wafer to form one or more bending regions, wherein the wafer material is removed substantially to the depth of the flexible dielectric membrane, and further wherein the material is removed between the at least two adjacent semiconductor dice within the group;

using a dicing saw to singulate the integrated circuit package by removing the wafer material and flexible membrane material connecting the group of semiconductor dice to the wafer assembly; and bending the flexible dielectric membrane at the one or more bending regions.

18. The method of claim 17 wherein the first conductive material and the second conductive material are the same material.

* * * * *